(12) United States Patent
Choi et al.

(10) Patent No.: US 9,293,515 B2
(45) Date of Patent: Mar. 22, 2016

(54) ORGANIC LIGHT-EMITTING DISPLAY DEVICE AND METHOD OF MANUFACTURING THE SAME

(71) Applicant: Samsung Display Co., Ltd., Yongin, Gyeonggi-Do (KR)

(72) Inventors: Jun-Ho Choi, Yongin (KR); Jin-Koo Chung, Yongin (KR); Kwan-Hyun Cho, Yongin (KR)

(73) Assignee: Samsung Display Co., Ltd., Samsung-ro, Giheung-Gu, Yongin-si, Gyeonggi-Do (KR)

( * ) Notice: Subject to any disclaimer, the term of this patent is extended or adjusted under 35 U.S.C. 154(b) by 0 days.

(21) Appl. No.: 14/173,178

(22) Filed: Feb. 5, 2014

(65) Prior Publication Data

US 2015/0076456 A1    Mar. 19, 2015

(30) Foreign Application Priority Data

Sep. 13, 2013  (KR) ......................... 10-2013-0110626

(51) Int. Cl.
*H01L 29/08*    (2006.01)
*H01L 27/32*    (2006.01)

(52) U.S. Cl.
CPC ................................. *H01L 27/3267* (2013.01)

(58) Field of Classification Search
CPC .................... H01L 27/3267; H01L 2251/5323
USPC ............................................. 257/40, 98–100
See application file for complete search history.

(56) References Cited

U.S. PATENT DOCUMENTS

| | | |
|---|---|---|
| 2004/0245531 A1 | 12/2004 | Fuji et al. |
| 2006/0038752 A1 | 2/2006 | Winters |
| 2008/0023724 A1* | 1/2008 | Takeda ................ H01L 51/5262 257/103 |
| 2011/0148944 A1* | 6/2011 | Kobayashi ........... G09G 3/3225 345/690 |
| 2011/0220922 A1* | 9/2011 | Kim ...................... H01L 27/326 257/88 |
| 2012/0104422 A1 | 5/2012 | Lee et al. |
| 2012/0168783 A1 | 7/2012 | Kim et al. |
| 2012/0313099 A1 | 12/2012 | Chung et al. |
| 2013/0001532 A1* | 1/2013 | Hwang ............... H01L 51/0058 257/40 |
| 2015/0048335 A1 | 2/2015 | Chung et al. |

FOREIGN PATENT DOCUMENTS

| | | |
|---|---|---|
| KR | 10-2011-0103735 A | 9/2011 |
| KR | 10-2012-0044876 A | 5/2012 |
| KR | 10-2012-0134464 A | 12/2012 |
| KR | 10-2015-0019885 A | 2/2015 |

* cited by examiner

*Primary Examiner* — Cuong Q Nguyen
*Assistant Examiner* — Nishath Yasmeen
(74) *Attorney, Agent, or Firm* — Robert E. Bushnell, Esq.

(57) ABSTRACT

An organic light-emitting display device and a method of manufacturing the organic light-emitting display device. The organic light-emitting display device is a dual emission display capable of displaying differing images on either side of the display, and includes a facing electrode that is selectively deposited in the first area but not in the second area, the selectivity being brought about by a varying an underlying material having differing adhesive forces with the material of the facing electrode. In addition, the underlying materials of the facing electrode and other intermediate layers of the organic light emitting diode device provide extra distance between the organic light emitting layer and a reflective electrode, so that exciton quenching is reduced, resulting in improved light emitting efficiency.

25 Claims, 15 Drawing Sheets

ORGANIC LIGHT-EMITTING DISPLAY DEVICE AND METHOD OF MANUFACTURING THE SAME

CLAIM OF PRIORITY

This application makes reference to, incorporates into this specification the entire contents of, and claims all benefits accruing under 35 U.S.C. §119 from an application earlier filed in the Korean Intellectual Property Office filed on Sep. 13, 2013 and there duly assigned Serial No. 10-2013-0110626

BACKGROUND OF THE INVENTION

1. Field of the Invention

One or more embodiments of the present invention relate to an organic light-emitting display device and a method of manufacturing the organic light-emitting display device.

2. Description of the Related Art

An organic light emitting display device is a self-emissive display including an organic compound that is electrically exited to emit light. The organic light emitting display device is driven via a low voltage, is thin, has a wide view angle, and a fast response speed. Thus, the organic light emitting display device has been regarded as a next-generation display that does not have the defects of a liquid crystal display (LCD) device or the like.

Compared to the LCD device, the organic light emitting display device can emit light on two sides. In order to implement top and bottom emissions at the same time, a cathode electrode of a bottom emission unit is necessarily patterned. However, it is difficult to use a fine metal mask that is typically used in the art, in a patterning operation of a cathode reflective electrode formed on an organic emitting layer

SUMMARY OF THE INVENTION

One or more embodiments of the present invention include an organic light-emitting display device, in which a pattern of a cathode, which is a top electrode, may be easily formed, and a method of manufacturing the organic light-emitting display device.

One or more embodiments of the present invention include an organic light-emitting display device having a dual emission structure wherein a top electrode thereof is produced by selective deposition of a conductor where an open mask is used in the production of a pattern.

One or more embodiments of the present invention may include a design for an organic light-emitting display device that reduces exciton quenching, to provide for improved luminance efficiency.

One or more embodiments of the present invention include a dual emitting organic light-emitting display device capable of producing differing images on opposite sides of the display panel.

One or more embodiments of the present invention include dual emitting organic light-emitting display device that is also transparent to external light.

According to one aspect of the present invention, there is provided an organic light-emitting display (OLED) device that includes a plurality of pixels, each of the pixels including a first area in which light is emitted from the display device in a first direction and not in a second direction opposite to the first direction, a second area in which light is emitted from the display device in the second direction and not in the first direction and a third area that is transparent to external light, a plurality of first electrodes arranged within the first area of each of the plurality of pixels, a plurality of second electrodes arranged within the second area of each of the plurality of pixels, an intermediate layer arranged on the plurality of first electrodes and the plurality of second electrodes, the intermediate layer including an organic emitting layer, a third electrode arranged on the intermediate layer and within both the first area and the second area, a first auxiliary layer arranged on the third electrode within the first area, a second auxiliary layer arranged on the third electrode within the second area and a fourth electrode arranged on the first auxiliary layer within the first area.

The fourth electrode may be absent from the second area and the third area. A portion of the fourth electrode may be arranged within the second area and the third area, and a thickness of the portion of the fourth electrode arranged within the second area and the third area may be less than a thickness of a portion of the fourth electrode arranged within the first area. The portion of the fourth electrode arranged within the second area may be arranged on the second auxiliary layer. The first auxiliary layer may be absent from the second area and the third area. The second auxiliary layer bay be absent from the first area. A portion of the second auxiliary layer may be arranged within the first area, and the first auxiliary layer may be arranged on the portion of the second auxiliary layer arranged within the first area. A portion of the first auxiliary layer may be arranged within the second area, and the second auxiliary layer may be arranged on the portion of the first auxiliary layer arranged within the second area. A thickness of the fourth electrode may be greater than a thickness of the third electrode. An adhesive force of the fourth electrode with respect to the first auxiliary layer may be greater than an adhesive force of the fourth electrode with respect to the second auxiliary layer. The first auxiliary layer may include one of tris(8-hydroxy-quinolinato)aluminum (Alq3), di-tungsten tetra(hexahydropyrimidopyrimidine)), fullerene, lithium fluoride (LiF), ADN [9,10-di(2-naphthyl)anthracene] and Liq: 8-hydroxyquinolinolato-lithium. The second auxiliary layer may include one of N,N'-diphenyl-N,N'-bis(9-phenyl-9H-carbazol-3-yl)biphenyl-4,4'-diamine, N(diphenyl-4-yl)9,9-dimethyl-N-(4(9-phenyl-9H-carbazol-3-yl)phenyl)-9H-fluorene-2-amine, 2-(4-(9,10-di(naphthalene-2-yl)anthracene-2-yl)phenyl)-1-phenyl-1H-benzo-[D]imidazole, m-MTDATA [4,4,4-tris(3-methylphenylphenylamino)triphenylamine], α-NPD (N,N'-bis(1-naphthyl)-N,N'-diphenyl[1,1'-biphenyl]-4,4'-diamine) and TPD [4,4'-Bis[N-(3-methylphenyl)-N-phenylamino]biphenyl]. The intermediate layer may include a first intermediate layer interposed between the organic emitting layer and the first and second electrodes and including at least one of a hole injection layer and a hole transport layer; and a second intermediate layer interposed between the organic light emitting layer and the third electrode, the second intermediate layer including at least one of an electron injection layer and an electron transport layer, wherein the first intermediate layer is thicker than the second intermediate layer.

According to another aspect of the present invention, there is provided a method of manufacturing an organic light-emitting display device that includes defining a plurality of pixels, each of the pixels including a first area in which light is emitted from the display device in a first direction and not in a second direction that is opposite to the first direction, a second area in which light is emitted from the display device in the second direction and not in the first direction and a third area that is transparent to external light, forming a plurality of first electrodes within the first area of each of the plurality of pixels, forming a plurality of second electrodes within the second area of each of the plurality of pixels, forming an intermediate layer on the plurality of first electrodes and on the plurality of second electrodes, the intermediate layer including an organic emitting layer, forming a third electrode on the intermediate layer within both the first area and the second area by depositing a metal for forming the third electrode, forming a first auxiliary layer on the third electrode within the first area, forming a second auxiliary layer on the third electrode within the second area and forming a fourth electrode within the first area via a vacuum deposition technique by applying a vapor that includes a metal for forming the fourth electrode to a top surface of the first auxiliary layer within the first area and a top surface of the second auxiliary layer within the second area of each pixel.

In the forming of a fourth electrode, the vapor that includes the metal for forming the fourth electrode may be applied to the first area, the second area and the third area simultaneously, the fourth electrode may be absent from and does not form within the second area or the third area. In the forming of a fourth electrode, the metal for forming the fourth electrode may be applied to the first area, the second area and the third area simultaneously, wherein a portion of the fourth electrode is formed within the second area and the third area, and a thickness of the portion of the fourth electrode formed within the second area and the third area may be less than a thickness of a portion of the fourth electrode formed within the first area. In the forming of a fourth electrode, the portion of the fourth electrode formed within the second area and the third area may be formed on the second auxiliary layer. The first auxiliary layer may be absent from the second area and the third area. The second auxiliary layer may be absent from the first area and the third area. A portion of the second auxiliary layer may be formed within the first area, and the first auxiliary layer may be formed on the portion of the second auxiliary layer formed within the first area. A portion of the first auxiliary layer may be formed within the second area and the third area, and the second auxiliary layer may be formed on the portion of the first auxiliary layer formed within the second area and the third area. A thickness of the fourth electrode may be greater than a thickness of the third electrode. An adhesive force of the metal for forming the fourth electrode with respect to the first auxiliary layer may be greater than an adhesive force of the metal for forming the fourth electrode with respect to the second auxiliary layer. The first auxiliary layer may include one of tris(8-hydroxyquinolinato)aluminum (Alq3), di-tungsten tetra(hexahydropyrimidopyrimidine)), fullerene, lithium fluoride (LiF), ADN [9,10-di(2-naphthyl)anthracene] and Liq: 8-hydroxyquinolinolato-lithium. The second auxiliary layer may include one of N,N'-diphenyl-N,N'-bis(9-phenyl-9H-carbazol-3-yl)biphenyl-4,4'-diamine, N(diphenyl-4-yl)9,9-dimethyl-N-(4(9-phenyl-9H-carbazol-3-yl)phenyl)-9H-fluorene-2-amine, 2-(4-(9,10-di(naphthalene-2-yl)anthracene-2-yl)phenyl)-1-phenyl-1H-benzo-[D]imidazole, m-MTDATA[4,4,4-tris(3-methylphenylphenylamino)triphenylamine], α-NPD (N,N'-bis(1-naphthyl)-N,N'-diphenyl[1,1'-biphenyl]-4,4'-diamine), and TPD [4,4'-Bis[N-(3-methylphenyl)-N-phenylamino]biphenyl]. The forming of the intermediate layer may include forming a first intermediate layer on the first and second electrodes and including at least one of a hole injection layer and a hole transport layer, forming the organic light emitting layer on the first intermediate layer and forming a second intermediate layer on the organic light emitting layer, the second intermediate layer including at least one of an electron injection layer and an electron transport layer, wherein the first intermediate layer is thicker than the second intermediate layer.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Figure 1:
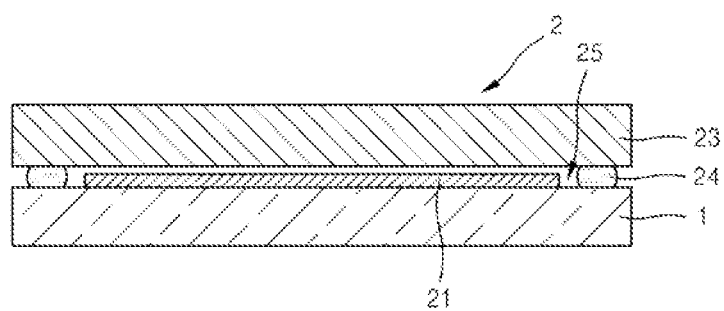
FIG. 1 is a schematic cross-sectional view illustrating an organic light-emitting display device according to an embodiment of the present invention.

Reference will now be made in detail to embodiments, examples of which are illustrated in the accompanying drawings, wherein like reference numerals refer to the like elements throughout. In this regard, the present embodiments may have different forms and should not be construed as being limited to the descriptions set forth herein. Accordingly, the embodiments are merely described below, by referring to the figures, to explain aspects of the present description.

It will be understood that although the terms "first", "second", etc. may be used herein to describe various components, these components should not be limited by these terms. These components are only used to distinguish one component from another.

As used herein, the singular forms "a," "an" and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or component is referred to as being "formed on," another layer, region, or component, it can be directly or indirectly formed on the other layer, region, or component. That is, for example, intervening layers, regions, or components may be present.

Sizes of elements in the drawings may be exaggerated for convenience of explanation. In other words, since sizes and thicknesses of components in the drawings are arbitrarily illustrated for convenience of explanation, the following embodiments are not limited thereto.

As used herein, the term "and/or" includes any and all combinations of one or more of the associated listed items. Expressions such as "at least one of," when preceding a list of elements, modify the entire list of elements and do not modify the individual elements of the list.

Turning now to FIG. 1, FIG. 1 is a schematic cross-sectional view illustrating an organic light-emitting display device according to an embodiment of the present invention. Referring to FIG. 1, the organic light-emitting display device includes a display unit 2 formed on a substrate 1.

The display unit 2 may include an organic light-emitting unit 21 formed on the substrate 1 and an encapsulation substrate 23 encapsulating the organic light-emitting unit 21.

The encapsulation substrate 23 prevents penetration of an external air or moisture into the organic light-emitting unit 21. The encapsulation substrate 23 is made out of a transparent member so that an image formed by using the organic light-emitting unit 21 may be transmitted through the encapsulation substrate 23.

Edges of the substrate 1 and the encapsulation substrate 23 are coupled to each other by using an encapsulation member 24 so that space 25 between the substrate 1 and the encapsulation substrate 23 is encapsulated. The space 25 may include a moisture absorbing material, a filling material or the like.

Figure 2:
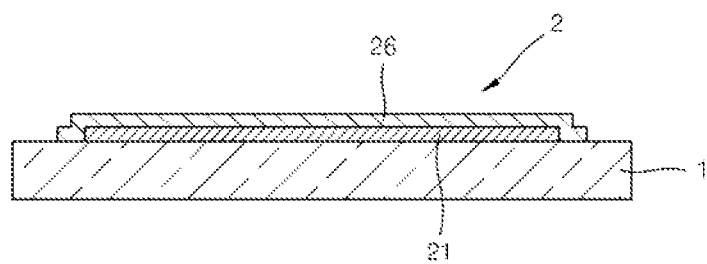
FIG. 2 is a schematic cross-sectional view illustrating an organic light-emitting display device according to another embodiment of the present invention.

FIG. 2 is a schematic cross-sectional view illustrating an organic light-emitting display device according to another embodiment of the present invention. As illustrated in FIG. 2, instead of the encapsulation substrate 23, a thin film encapsulation layer 26 may be formed on the organic light-emitting unit 21 to protect the organic light-emitting unit 21 from penetration of the external air and moisture. The thin film encapsulation layer 26 may be made out of a plurality of inorganic layers or a combination of an inorganic layer and an organic layer.

The organic layer of the thin film encapsulation layer 26 may be made out of a polymer, and in detail, the organic layer may be a single layer or a stacked layer made out of one of polyethylene terephthalate, polyimide, polycarbonate, epoxy, polyethylene, and polyacrylate. For example, the organic layer may be made out of polyacrylate, and in detail, the organic layer may include a polymerized monomer composition including a diacrylate-based monomer and triacrylate-based monomer. Also, a photo-initiator such as trimethyl benzoyl diphenyl phosphine oxide (TPO) that is well-known in the art may be further included in the monomer composition, but the embodiments of the present invention are not limited thereto.

The inorganic layer of the thin film encapsulation layer 26 may be a single layer or a stacked layer including a metal oxide or a metal nitride. In detail, the inorganic layer may include one of $SiN_x$, $Al_2O_3$, $SiO_2$, and $TiO_2$. An exposed uppermost layer of the thin film encapsulation layer 26 may be made out of an inorganic layer in order to prevent moisture penetration with respect to the organic light-emitting unit 21.

The thin film encapsulation layer 26 may include at least one sandwich structure in which at least one organic layer is inserted between at least two inorganic layers. Alternatively, the thin film encapsulation layer 26 may include at least one sandwich structure in which at least one inorganic layer is inserted between at least two organic layers. Alternatively, the thin film encapsulation layer 26 may include a sandwich structure in which at least one organic layer is inserted between at least two inorganic layers, or a sandwich structure in which at least one inorganic layer is inserted between at least two organic layers.

The thin film encapsulation layer 26 may sequentially include a first inorganic layer, a first organic layer, and a second inorganic layer sequentially stacked on a top portion of the organic light-emitting unit 21. Alternatively, the thin film encapsulation layer 26 may sequentially include a first inorganic layer, a first organic layer, a second inorganic layer, a second organic layer, and a third inorganic layer stacked on a top portion of the organic light-emitting unit 21.

Alternatively, the thin film encapsulation layer 26 may sequentially include a first inorganic layer, a first organic layer, a second inorganic layer, a second organic layer, a third inorganic layer, a third organic layer, and a fourth inorganic layer stacked on a top portion of the organic light-emitting unit 21.

A halogenated metal layer including LiF may be further included between the organic light-emitting unit 21 and the first inorganic layer. The halogenated metal layer may prevent damage of the organic light-emitting unit 21 when forming the first inorganic layer by using a sputtering method or a plasma deposition method.

The first organic layer may have a smaller surface area than the second inorganic layer, and the second organic layer may have a smaller surface area than the third inorganic layer.

Alternatively, the first organic layer may be completely covered by the second inorganic layer, and the second organic layer may be completely covered by the third inorganic layer.

Figure 3:
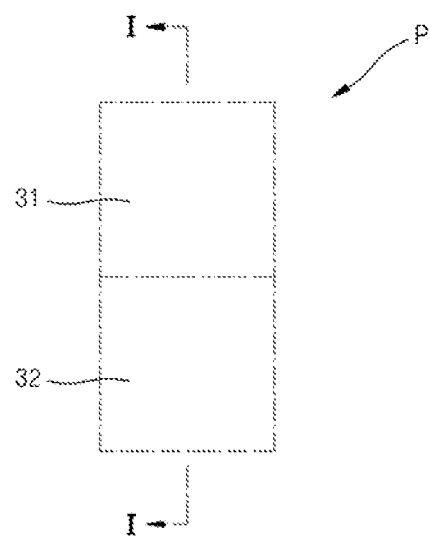
FIG. 3 is a plan view illustrating a pixel of an organic light-emitting unit illustrated in FIGS. 1 and 2 according to an embodiment of the present invention.

The organic light-emitting unit 21 of FIGS. 1 and 2 may include a plurality of pixels. FIG. 3 is a plan view illustrating a pixel P of the organic light-emitting unit 21 illustrated in FIGS. 1 and 2 according to embodiments of the present invention.

The pixel P may include a first area 31 and a second area 32 that are arranged adjacent to each other. The first area 31 may be a bottom emission area, and the second area 32 may be a top emission area.

The pixel P illustrated in FIG. 3 may be a single sub-pixel in which the first area 31 and the second area 32 emit single-colored light, however the pixel P is not limited thereto, and may also be a single sub-pixel where the first area 31 and the second area 32 emit light of different colors. Pixel P of FIG. 3 is used to describe the different embodiments of FIGS. 4 to 13 to be described later. Hereinafter, the case where the pixel P is a single sub-pixel in which the first area 31 and the second area 32 emit single-colored light will be described.

The pixel P may be a sub-pixel that emits light of red, green, or blue color. In addition to the pixel P illustrated in FIG. 3, the organic light-emitting unit 21 of FIGS. 1 and 2 further include a plurality of sub-pixels that emit light of another color from among red, green, and blue colors.

Alternatively, the pixel P may be a sub-pixel that emits red, green, or blue light. In addition to the pixel P illustrated in FIG. 3, the organic light-emitting unit 21 of FIGS. 1 and 2 further includes a plurality of sub-pixels that emit light of another color from among red, green, and blue colors.

Alternatively, sub-pixels that emit light of the red, green, and blue colors and/or white light may form a single pixel that emits white light as the colors of light of the sub-pixels are mixed. In this case, a color converting layer that converts white light of each pixel to a predetermined color or a color filter may be applied.

The red, green, blue, and/or white colors are exemplary, and the embodiments of the present invention are not limited thereto. In other words, as long as white light is emitted, combination of various colors besides the combination of the red, green, blue, and/or white light may also be used.

Figure 4:
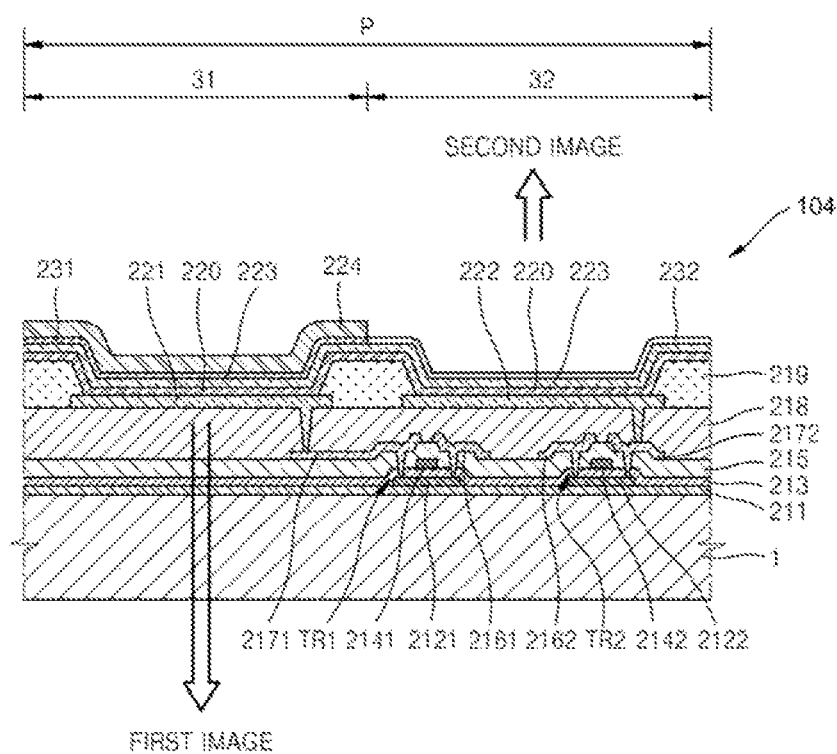
FIG. 4 is a cross-sectional view illustrating the pixel cut along line I-I of FIG. 3 according to an embodiment of the present invention.

FIG. 4 is a cross-sectional view of a display unit 104 which is a cross-section of a variation of pixel P of FIG. 3 cut along a line I-I of FIG. 3 according to an embodiment of the present invention. Referring to FIG. 4, the first area 31 emits a first image in a first direction toward the substrate 1, and the second area 32 emits a second image in a second direction which is opposite the first direction. Preferably, the first area 31 emits light only in the first direction and not the second direction, while the second area 32 emits light only in the second direction and not the first direction. To this end, organic light-emitting devices are arranged in the first area 31 and the second area 32. The organic light-emitting devices are electrically connected to the first area 31 and the second area 32. A first pixel circuit unit of the first area 31 is not arranged on an emission path by being arranged within the second area 32, thereby preventing a decrease in a light-emitting efficiency and luminance of the first image. As a second image is emitted from the second area 32 in the opposite direction from the substrate 1, the first pixel circuit unit that is electrically connected to the organic light-emitting device of the first area 31 and the second pixel circuit unit that is electrically connected to the organic light-emitting device of the second area 32 may both be arranged in the second area 32. The first pixel circuit unit and the second pixel circuit unit may be each an independent pixel circuit unit, and accordingly, the first image and the second image may not be identical images but different images.

However, the embodiments of the present invention are not limited thereto; a single pixel circuit unit that is electrically connected to each of the organic light-emitting device of the first area and the organic light-emitting device of the second area 32 may also be included. The pixel circuit unit may be located in the second area 32 to prevent a decrease in a light-emitting efficiency and luminance of the first image.

Figure 5:
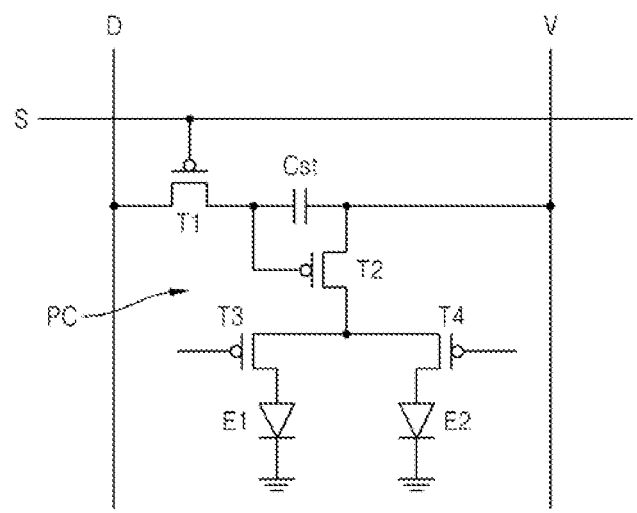
FIG. 5 is a circuit diagram illustrating a pixel circuit unit according to an embodiment of the present invention.

FIG. 5 is a circuit diagram illustrating a pixel circuit unit PC, which is a single pixel circuit unit, according to an embodiment of the present invention. Referring to FIG. 5, a scan line S, a data line D, and a Vdd line V, which is a driving power supply, are electrically connected to the pixel circuit unit PC. Although not shown in FIG. 5, according to a structure of the pixel circuit unit PC, other various conductive lines may be further included in addition to the scan line S, the data line D, and the Vdd line V.

The pixel circuit unit PC includes a switching thin film transistor T1 that is connected to the scan line S and the data line D, a driving thin film transistor T2 that is connected to the switching thin film transistor T1 and the Vdd line V, and a capacitor Cst that is connected to the switching thin film transistor T1 and the driving thin film transistor T2.

A gate electrode of the switching thin film transistor T1 is connected to the scan line S to receive a scan signal, and a first electrode (i.e. one of the source and drain electrodes) is connected to the data line D, a second electrode (i.e. another of the source and drain electrodes) is connected to a capacitor Cst and a gate electrode of the driving thin film transistor T2.

A first electrode of the driving thin film transistor T2 is connected to the Vdd line V and the capacitor Cst, and a second electrode of the driving thin film transistor T2 is connected to a first electrode of a first emission control thin film transistor T3 and a first electrode of a second emission control thin film transistor T4.

A second electrode of the first emission control thin film transistor T3 may be electrically connected to a first organic light-emitting device E1 located in the first area 31, and a second electrode of the second emission control thin film transistor T4 may be electrically connected to a second organic light-emitting device E2 located in the second area 32. Gate electrodes of the first emission control thin film transistor T3 and the second emission control thin film transistor T4 are electrically connected to additional emission signal lines.

While the switching thin film transistor T1, the driving thin film transistor T2, and the first and second emission control thin film transistors T3 and T4 of FIG. 5 are all P-type transistors, they are not limited thereto, and at least one of the thin film transistors may be an N-type transistor. Also, the number of thin film transistors and capacitors is not limited to those in the illustrated embodiment. Thus, at least two thin film transistors and at least one capacitor may be further included according to the pixel circuit unit PC.

According to the structure of the pixel circuit unit PC as described above, image information input through the data line D may be used to form an image by using the first organic light-emitting device E1 when the first emission control thin film transistor T3 is opened. Also, the image information input may be used to form an image by using the second organic light-emitting device E2 when the second emission control thin film transistor T4 is opened. Thus, the first organic light-emitting device E1 and the second organic light-emitting device E2 may form different images. Thus, dual emission may be achieved through time division driving so that an image on a top emission surface and an image on a bottom emission surface are not limited to reversed mirror images of each other. Nevertheless, when the same switching signal is applied to the first emitting thin film transistor T3 and the second emitting thin film transistor T4 in a state where the same data signal is applied to the pixel circuit unit PC, a reversed mirror image may be displayed on top and bottom surfaces. As described above, the pixel circuit unit PC may allow various screen configurations while the basic structure of the pixel circuit unit PC is shared by the first organic light-emitting device E1 and the second organic light-emitting device E2.

Referring to FIG. 4 again, a first thin film transistor TR1 and a second thin film transistor TR2 are located on the substrate 1 and are respectively electrically connected to a first electrode 221 included in the first area 31 and a second electrode 222 included in the second area 32. The first thin film transistor TR1 and the second thin film transistor TR2 may be driving thin film transistors of the first pixel circuit unit and the second pixel circuit unit described above. Alternatively, the first thin film transistor TR1 and the second thin film transistor TR2 may be respectively the first emission control thin film transistor T3 and the second emission control thin film transistor T4 illustrated in FIG. 5.

In detail, as illustrated in FIG. 4, a buffer layer 211 is formed on the substrate 1, semiconductor active layers 2121 and 2122 and a pixel circuit unit including the first and second thin film transistors T1 and T2 are formed on the buffer layer 211.

The buffer layer 211 is made out of a transparent insulating material and prevents penetration of impurity elements into the semiconductor active layers 2121 and 2122. Also, the buffer layer 211 planarizes a surface of the substrate 1. Thus, the buffer layer 211 may be made out of various materials that are capable of performing these functions. For example, the buffer layer 211 may be made out of an inorganic material such as a silicon oxide, a silicon nitride, a silicon oxynitride, an aluminum oxide, an aluminum nitride, a titanium oxide, or a titanium nitride; an organic material such as polyimide, polyester, or an acryl; or a stack structure including the inorganic and organic materials. The buffer layer 211 is not an essential element and may be omitted according to necessity.

The semiconductor active layers 2121 and 2122 may be made out of polycrystalline silicon, but are not limited thereto, and may also be made out of an oxide semiconductor. For example, the semiconductor active layers 2121 and 2122 may be a G-I—Z—O layer [$(In_2O_3)_a(Ga_2O_3)_b(ZnO)_c$ layer] (where a, b, and c are real numbers that respectively satisfy the conditions of a≥0, b≥0, and c>0).

A gate insulating layer 213 is formed on the buffer layer 211 to cover the semiconductor active layers 2121 and 2122, and gate electrodes 2141 and 2142 are formed on the gate insulating layer 213.

An interlayer insulating layer 215 is formed on the gate insulating layer 213 to cover the gate electrodes 2141 and 2142, and source electrodes 2161 and 2162 and drain electrodes 2171 and 2172 are formed on the interlayer insulating layer 215 so that the source electrodes 2161 and 2162 and the drain electrodes 2171 and 2172 respectively contact the semiconductor active layers 2121 and 2122 through contact holes.

Structures of the first and second thin film transistors TR1 and TR2 as described above are not limited thereto, and various other structures of thin film transistors are also available.

A first insulating layer 218 is formed to cover the first and second thin film transistors TR1 and TR2. The first insulating layer 218 may be a single insulating layer or a plurality of insulating layers whose top surface is planarized. The first insulating layer 218 may be made out of an inorganic material and/or an organic material.

As illustrated in FIG. 4, the first electrode 221 of the first organic light-emitting device that is electrically connected to the first thin film transistor TR1 and the second electrode 222 of the second organic light-emitting device that is electrically connected to the second thin film transistor TR2 are formed on the first insulating layer 218. The first electrode 221 and the second electrode 222 are formed as an island.

A second insulating layer 219 is formed on the first insulating layer 218 to cover edges of the first electrode 221 and the second electrode 222. The second insulating layer 219 may be made out of an organic material such as acryl or polyimide.

An intermediate layer 220 including an organic emitting layer is formed on the first electrode 221 and the second electrode 222. The intermediate layer 220 may be made out of a low-molecular or polymer organic layer. A third electrode 223 is formed to cover the intermediate layer 220, thereby completing the organic light-emitting devices.

Figure 6:
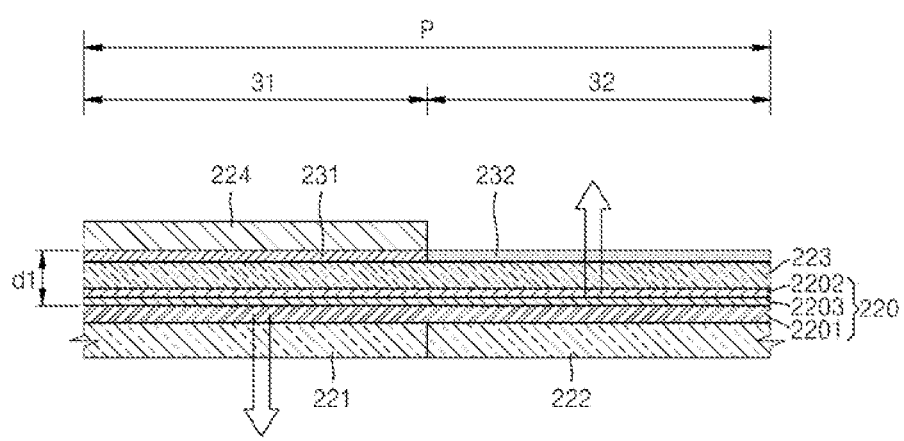
FIG. 6 is a cross-sectional view to specifically explain organic light-emitting devices of FIG. 4.

FIG. 6 is a cross-sectional view to specifically explain organic light-emitting devices of FIG. 4. As illustrated in FIG. 6, the intermediate layer 220 may include a first intermediate layer 2201, a second intermediate layer 2202, and an organic emitting layer 2203 interposed between the first and second intermediate layers 2201 and 2202. The first intermediate layer 2201 is interposed between the organic emitting layer 2203 and the first and second electrodes 221 and 222, and may include a hole injection layer (HIL) and/or a hole transport layer (HTL). The second intermediate layer 2202 is interposed between the organic emitting layer 2203 and a third electrode 223, and may include an electron transport layer (ETL) and/or an electron injection layer (EIL).

The organic emitting layer 2203 may be formed for each of red, green, and blue sub-pixels, and the first and second intermediate layers 2201 and 2202 are common layers for the respective sub-pixels. Referring to FIG. 4, the first area 31 and the second area 32 are included in a pixel P that forms a sub-pixel, and thus, a single-color organic emitting layer 2203 may be deposited in the first area 31 and the second area 32, however the embodiments of the present invention are not limited thereto, and the organic emitting layer 2203 may be in different colors in the first area 31 and the second area 32.

The HIL may include a phthalocyanine compound such as copper phthalocyanine or a Starburst type amine such as TCTA, m-MTDATA, or m-MTDAPB. The HTL may include N,N'-bis(3-methylphenyl)-N,N'-diphenyl-[1,1-biphenyl]-4, 4'-diamine (TPD), or N,N'-di(naphthalene-1-yl)-N,N'-diphenyl benzidine (α-NPD).

The ETL may include tris(8-hydroxy-quinolinato)aluminum (Alq3). The EIL may include LiF, NaCl, CsF, $Li_2O$, BaO, or Liq.

The organic emitting layer 2203 may include a host material and a dopant material. The host material may include Alq3, 9,10-di(naphth-2-yl)anthracene (ADN), 2-Tert-butyl-9,10-di(naphth-2-yl)anthracene (TBADN), 4,4'-bis(2,2-diphenyl-ethene-1-yl)biphenyl (DPVBi), or 4,4'-bis(2,2-di(4-methylphenyl)-ethene-1-yl)biphenyl (p-DMDPVBi). The dopant material may include DPAVBi (4,4'-bis[4-(di-p-tolylamino) styril]biphenyl), ADN (9,10-di(naph-2-tyl)anthracene), or TBADN (2-tert-butyl-9,10-di(naphth-2-yl)anthracene).

The first electrode 221 and the second electrode 222 may function as anode electrodes, and the third electrode may function as a cathode electrode, however the polarities of the first and second electrode 221 and 222 and the third electrode 223 may instead be exchanged.

When the first electrode 221 and the second electrode 222 function as anode electrodes, the first electrode 221 and the second electrode 222 may include ITO, IZO, ZnO, or $In_2O_3$, which have high work functions. The second electrode 222 included in the second area 32 in which an image is formed in a direction away from the substrate 1 may further include a reflective layer (not shown) that includes at least one of Ag, Mg, Al, Pt, Pd, Au, Ni, Nd, Ir, Cr, Li, Yb, Co, Sm, and Ca.

When the third electrode 223 functions as a cathode electrode, the third electrode 223 may be made out of a metal such as Ag, Mg, Al, Pt, Pd, Au, Ni, Nd, Ir, Cr, Li, Yb, Co, Sm or Ca. In order that a second image may be easily formed, light from an emitting layer may have to be transmitted through the third electrode 223. To this end, the third electrode 223 may be a thin film made out of Mg and/or Mg alloy. The third electrode 223 may also be made out of a thin film made out of Ag and/or Ag alloy which has a relatively high light transmissivity. The third electrode 223 may also be formed by co-depositing or stacking Mg and/or Mg alloy and Ag and/or Ag alloy.

Unlike the first electrode 221 and the second electrode 222, the third electrode 223 is formed as a common electrode. Thus, a common voltage is applied to all pixels. Also, the third electrode 223 may be formed by commonly depositing the metal using an open mask without patterning the third electrode 223 for each pixel. Accordingly, the third electrode 223 may be located both in the first area 31 and the second area 32.

On the third electrode 223, a first auxiliary layer 231 is formed in the first area 31, and a second auxiliary layer 232 is formed in the second area 32. According to the embodiment illustrated in FIG. 4, the first auxiliary layer 231 may be patterned to be formed not in the second area 32 but only in the first area 31, and the second auxiliary layer 232 may be patterned to be formed in the second area 32 but not in the first area 31.

The first auxiliary layer 231 may be made out of a metal that is used to produce the fourth electrode 224, particularly, of a material that Mg and/or Mg alloy easily bonds thereto. Likewise, the second auxiliary layer 232 may be made out of a metal that is used to produce the fourth electrode 224, particularly, of a material that Mg and/or Mg alloy easily bonds thereto.

For example, the first auxiliary layer 231 may be made out of a material including [9,10-di(2-naphthyl)anthracene], or Liq: 8-hydroxyquinolinolato-lithium, and the second auxiliary layer 232 may be made out of a material including N,N'-diphenyl-N,N'-bis(9-phenyl-9H-carbozole-3-yl)biphenyl-4, 4'-diamine, N(diphenyl-4-yl)9,9-dimethyl-N-(4(9-phenyl-9H-carbazole-3-yl)phenyl)-9H-fluorene-2-amine, 2-(4-(9, 10-di(naphthalene-2-yl)anthracene-2-yl)phenyl)-1-phenyl-1H-benzo-[D]imidazole, m-MTDATA [4,4,4-tris(3-methylphenylphenylamino)triphenylamine], α-NPD (N,N'-bis(1-naphthyl)-N,N'-diphenyl[1,1'-biphenyl]-4,4'-diamine), or TPD [4,4'-Bis[N-(3-methylphenyl)-N-phenylamino]biphenyl].

After forming the first auxiliary layer 231 and the second auxiliary layer 232 on the third electrode 223, the fourth electrode 224 is formed. The fourth electrode 224 may be formed by attempting to commonly deposit, using for example a vapor or vacuum deposition technique, a metal for forming the fourth electrode over all pixels that include the first area 31 and the second area 32 by using an open mask.

When a metal for forming the fourth electrode 224 is attempted to be commonly deposited over all pixels by using an open mask, the metal for forming the fourth electrode 224 selectively deposits (i.e. is easily formed) on the first auxiliary layer 231, but does not form or accumulate on the second auxiliary layer 232. This is because an adhesive force of the fourth electrode 224 with respect to the first auxiliary layer 231 is greater than an adhesive force of the fourth electrode 224 with respect to the second auxiliary layer 232.

Accordingly, the fourth electrode 224 may be automatically patterned such that it is located within the first area 31, but not within the second area 32. Thus, without using an additional patterning mask, the fourth electrode 224 may be easily patterned by the above selective deposition technique.

The metal for forming the fourth electrode may be Mg and/or Mg alloy that easily forms (i.e. selectively deposits) on the first auxiliary layer 231 but not on the second auxiliary layer 232. However, the metal for forming the fourth electrode is not limited thereto, and any metal that has a greater adhesive force with respect to the first auxiliary layer 231 than with respect to the second auxiliary force 232 may be selected from the group consisting of Ag, Mg, Al, Pt, Pd, Au, Ni, Nd, Ir, Cr, Li, Yb, Co, Sm, and Ca to be used as a metal for forming the fourth electrode.

While not shown in the drawings, the fourth electrode 224 may be formed to contact the third electrode 223 in an area outside the first area 31 and the second area 32. The first auxiliary layer 231 and the second auxiliary layer 232 may not be present in an area where the fourth electrode 224 contacts the third electrode 223.

As described above, the third electrode 223 is made out of a thin film and functions as a common electrode through which a common voltage is applied to all pixels, and thus, if surface resistance increases, a voltage drop may occur. As the fourth electrode 224 contacts the third electrode 223, a voltage drop of the third electrode 223 may be reduced. To this end, the fourth electrode 224 may be thicker than the third electrode 223.

The fourth electrode 224 is formed in the first area 31, and when the organic light-emitting device of the first area 31 emits a first image, the fourth electrode 224 may function as a reflection plate, and thus, image quality of the first image may be further improved, accordingly.

The first intermediate layer 2201 may be thicker than the second intermediate layer 2202. In this case, as a sufficient distance between the organic emitting layer 2203 and the second electrode 222 may be provided in the second area 32 which is a top emission area, exciton quenching may be prevented, thereby also increasing light-emitting efficiency.

In the first area 31 which forms a bottom emission type organic light-emitting device, the second intermediate layer 2202 may be thinner than the first intermediate layer 2201, and in this case, a distance between the organic emitting layer 2203 from which light is emitted and the fourth electrode 224 which is a reflection plate is relatively short, and thus, exciton quenching may occur, which may decrease light-emitting efficiency. According to the current embodiment of the present invention, as illustrated in FIG. 6, as the first auxiliary layer 231 is interposed between the organic emitting layer 2203 and the fourth electrode 224 in the first area 31, a distance d1 between the organic emitting layer 2203 and the fourth electrode 224 may be increased by a thickness of the first auxiliary layer 231 in the first area 31, and an influence of exciton quenching described above may be reduced, thereby increasing light-emitting efficiency.

Figure 7:
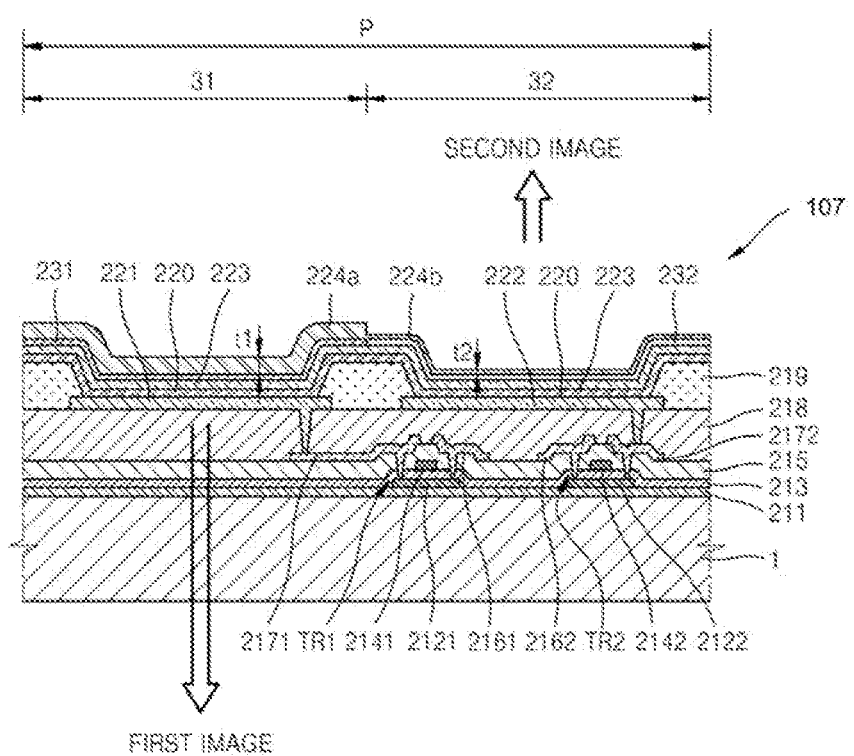
FIG. 7 is a cross-sectional view of the pixel of FIG. 3, cut along line I-I, according to an embodiment of the present invention.

FIG. 7 is a cross-sectional view of a display unit 107, which is a cross-section of a variation of pixel P of FIG. 3, cut along a line I-I of FIG. 3 according to another embodiment of the present invention. As described above, even a metal for forming the fourth electrode 224, in detail, Mg and/or Mg alloy, is not easily bonded on the second auxiliary layer 232, however in the embodiment of FIG. 7, a relatively small amount of metal for forming the fourth electrode 224 may nevertheless be deposited on the second auxiliary layer 232.

Thus, while the second auxiliary layer 232 is formed in the second area 32, when a metal for forming the fourth electrode 224 is applied to the first area 31 and the second area 32, the fourth electrode 224 may be formed both in the first area 31 and the second area 32 as illustrated in FIG. 7.

In FIG. 7 however, although the metal for forming the fourth electrode 224 is partially deposited on the second auxiliary layer 232, an amount of the metal is small, and thus, a thickness t2 of a portion 224*b* of the fourth electrode 224 that forms within the second area 32 is much less than a thickness t1 of a portion 224*a* of the fourth electrode 224 that is located in the first area 31. Thus, the transmissivity of the second image may not remarkably decrease due to the portion 224*b* of the fourth electrode 224 arranged within the second area 32.

Figure 8:
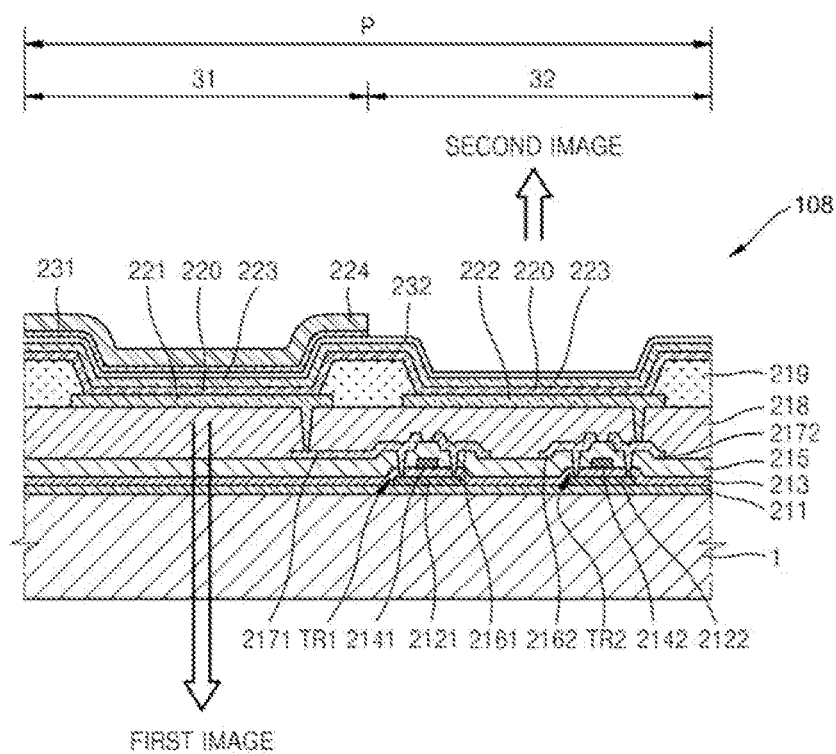
FIG. 8 is a cross-sectional view of the pixel of FIG. 3, cut along line I-I, according to another embodiment of the present invention.
Figure 9:
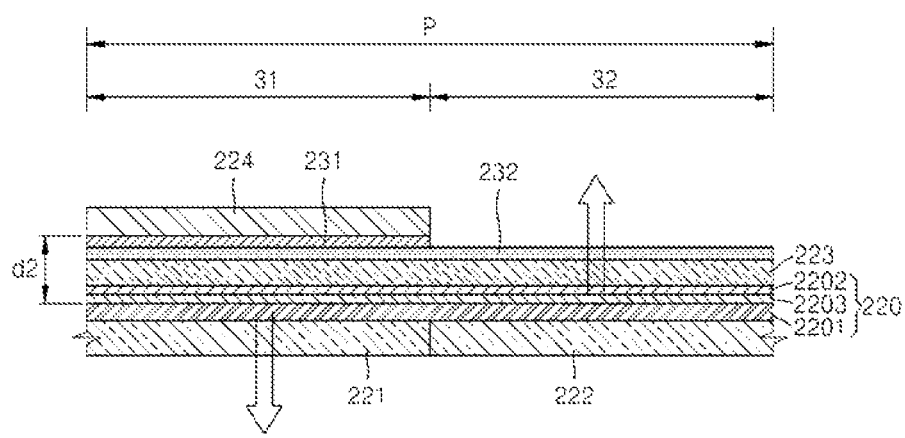
FIG. 9 is a cross-sectional view to specifically explain organic light-emitting devices of FIG. 8.

Turning now to FIGS. 8 and 9, FIG. 8 is a cross-sectional view of a display unit 108, which is a cross-section of a variation of pixel P of FIG. 3, cut along a line I-I of FIG. 3 according to another embodiment of the present invention, and FIG. 9 is a cross-sectional view to specifically explain organic light-emitting devices of FIG. 8.

Unlike the embodiments illustrated in FIGS. 4 and 6, according to the embodiment of FIGS. 8 and 9, the second auxiliary layer 232 is formed in both the first area 31 and the second area 32, and the first auxiliary layer 231 is formed only in the first area 31. The first auxiliary layer 231 may be formed on the second auxiliary layer 232 in the first area 31.

In this state, a metal for forming the vapor of the material that constitutes the fourth electrode is applied to both the first area 31 and the second area 32, and the fourth electrode 224 is selectively formed only on the first auxiliary layer 231 in the first area 31, but is not formed on the second auxiliary layer 232 of the second area 32. Accordingly, the fourth electrode 224 may be easily patterned without using an additional patterning mask.

Also, as the second auxiliary layer 232 and the first auxiliary layer 231 are interposed between the organic emitting layer 2203 and the fourth electrode 224 in the first area 31, a distance d2 between the organic emitting layer 2203 and the fourth electrode 224 in the first area 31 may be increased by thicknesses of the first auxiliary layer 231 and the second auxiliary layer 232, and the influence of exciton quenching described above may be reduced, thereby increasing light-emitting efficiency.

Figure 10:
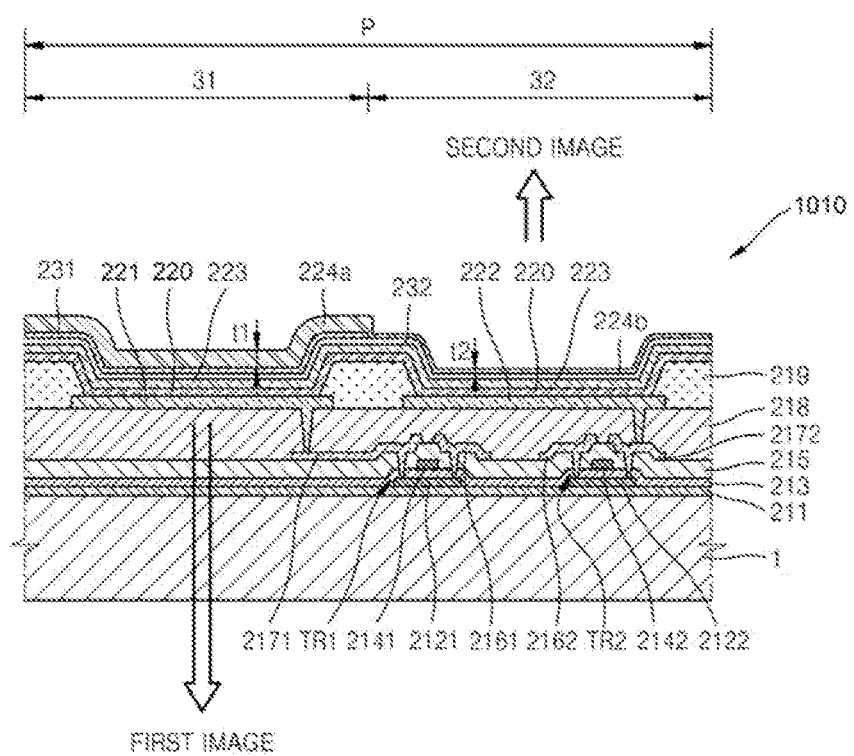
FIG. 10 is a cross-sectional view of the pixel of FIG. 3, cut along line I-I, according to another embodiment of the present invention.

FIG. 10 is a cross-sectional view of a display unit 1010, which is a cross-section of a variation of pixel P of FIG. 3, cut along a line I-I of FIG. 3 according to another embodiment of the present invention. Unlike the embodiment illustrated in FIG. 8, according to the embodiment of FIG. 10, the fourth electrode 224 is formed not only in the first area 31, but also in the second area 32.

Even if the metal for forming the fourth electrode is partially deposited on the auxiliary layer 232, the amount of such metal is small, and thus a thickness t2 of a portion 224b of the fourth electrode 224 that is located within the second area 32 is far thinner than a thickness t1 of a portion 224a of the fourth electrode 224 that is located in the first area 31. Thus, the transmissivity of the second image may not remarkably decrease due to the portion 224b of the fourth electrode 224 that is located in the second area 32.

Figure 11:
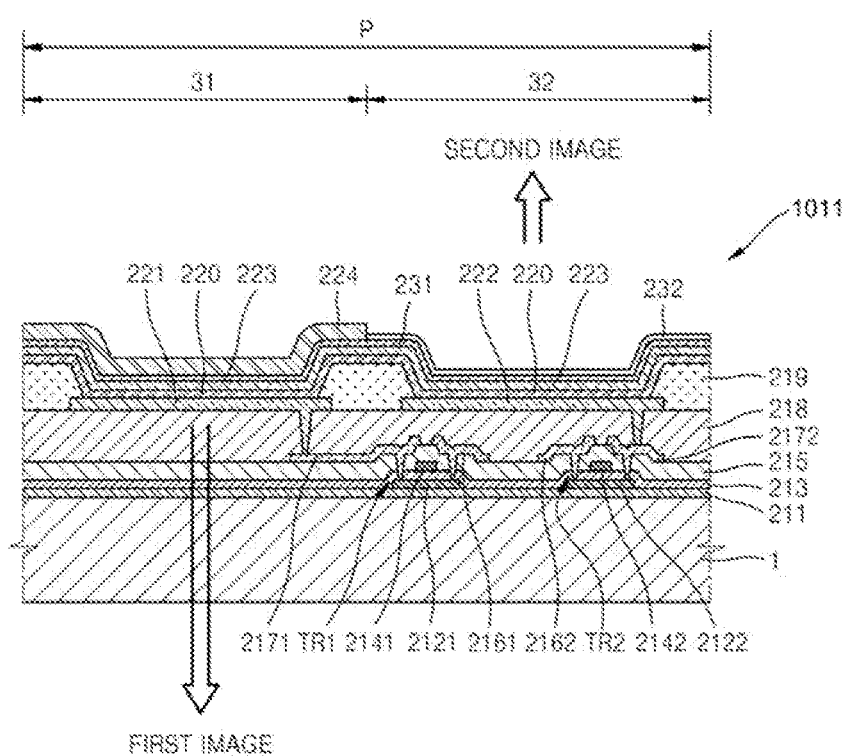
FIG. 11 is a cross-sectional view of the pixel of FIG. 3, cut along line I-I, according to another embodiment of the present invention.
Figure 12:
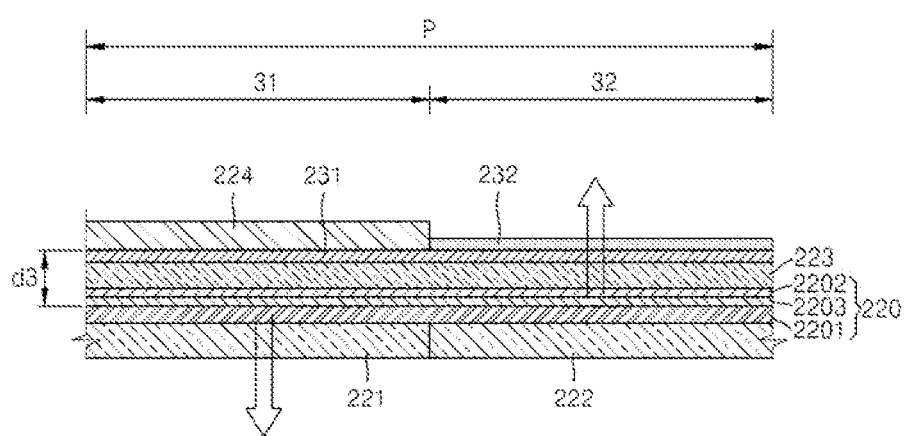
FIG. 12 is a cross-sectional view to specifically explain organic light-emitting devices of FIG. 11.

Turning now to FIGS. 11 and 12, FIG. 11 is a cross-sectional view of a display unit 1011, which is a cross-section of a variation of pixel P of FIG. 3, cut along a line I-I of FIG. 3 according to another embodiment of the present invention, and FIG. 12 is a cross-sectional view to specifically explain organic light-emitting devices of FIG. 11.

Unlike the embodiment illustrated in FIGS. 4 and 6, according to the embodiment of FIGS. 11 and 12, the first auxiliary layer 231 is formed both in the first area 31 and the second area 32, and the second auxiliary layer 232 is formed on the first auxiliary layer 231 and only in the second area 32.

In this embodiment of FIGS. 11 and 12, a metal for forming the fourth electrode 224 is applied to the first area 31 and the second area 32, and the fourth electrode 224 is selectively deposited only on the first auxiliary layer 231 in the first area 31 and not on the second auxiliary layer 232 of the second area 32. Accordingly, the fourth electrode 224 may be easily patterned without using an additional patterning mask.

Also, as the first auxiliary layer 231 is interposed between the organic emitting layer 2203 and the fourth electrode 224 in the first area 31, a distance d3 between the organic emitting layer 2203 and the fourth electrode 224 in the first area 31 may be increased by a thickness of the first auxiliary layer 231, and the influence of exciton quenching described above may be reduced, thereby increasing light-emitting efficiency.

Figure 13:
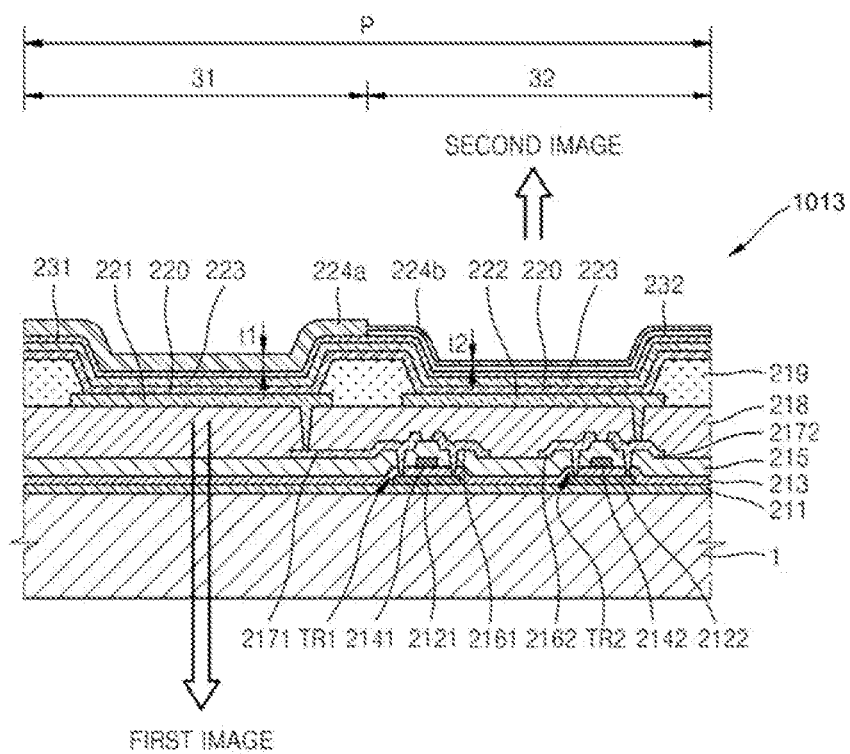
FIG. 13 is a cross-sectional view of the pixel of FIG. 3, cut along line I-I, according to another embodiment of the present invention.

FIG. 13 is a cross-sectional view of a display unit 1013, which is a cross-section of a variation of pixel P of FIG. 3, cut along a line I-I of FIG. 3 according to another embodiment of the present invention. Unlike the embodiment illustrated in FIG. 11, according to the embodiment of FIG. 13, the fourth electrode 224 is formed not only in the first area 31 but also in the second area 32.

Even if the metal for forming the fourth electrode 224 is partially deposited on second auxiliary layer 232, an amount of said metal is small, and thus a thickness t2 of a portion 224b of the fourth electrode 224 that is located within the second area 32 is much smaller than a thickness t1 of a portion 224a of the fourth electrode 224 that is located in the first area 31. Thus, the transmissivity of the second image may not remarkably decrease due to the portion 224b of the fourth electrode 224 that is arranged within the second area 32.

Figure 14:
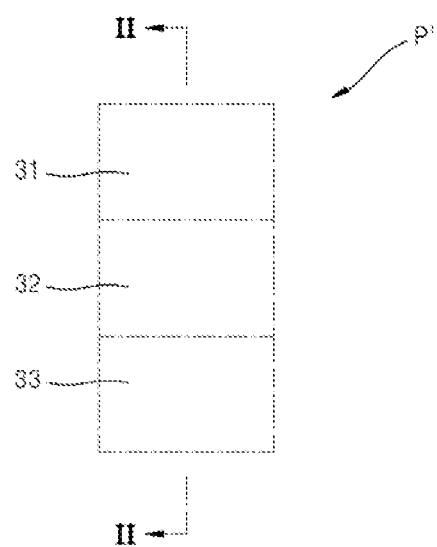
FIG. 14 is a plan view illustrating a pixel of an organic light-emitting unit of FIGS. 1 and 2, according to an embodiment of the present invention.

FIG. 14 is a plan view illustrating a pixel P' of the organic light-emitting unit 21 illustrated in FIGS. 1 and 2, according to another embodiment of the present invention. The pixel P' of FIG. 14 is used to describe the designs of FIGS. 15 to 17 to be described later. Pixel P' of FIG. 14 includes a first area 31, a second area 32, and a third area 33 that are adjacent to one another. The first area 31 may be a bottom emission area, the second area 32 may be a top emission area, and the third area 33 may be an external light transmission area through which external light is transmitted in a thickness direction of an organic light-emitting device. While the first area 31, the second area 32, and the third area 33 are sequentially arranged in a vertical direction in FIG. 14, the embodiments of the present invention are not limited thereto. For example, the third area 33, the first area 31, and the second area 32 may instead be sequentially arranged, or the first area 31, the third area 33, and the second area 32 may instead be sequentially arranged.

In addition, as illustrated in FIG. 14, the third area 33 may be included for each pixel P', but the embodiments of the present invention are not limited thereto. For example, the third area 33 may be included only in a predetermined number of pixels. Alternatively, the third area 33 may be included for sub-pixels that form a single pixel, for example, for each of red, green, and blue sub-pixels or for each of red, green, blue, and white sub-pixels.

Figure 15:
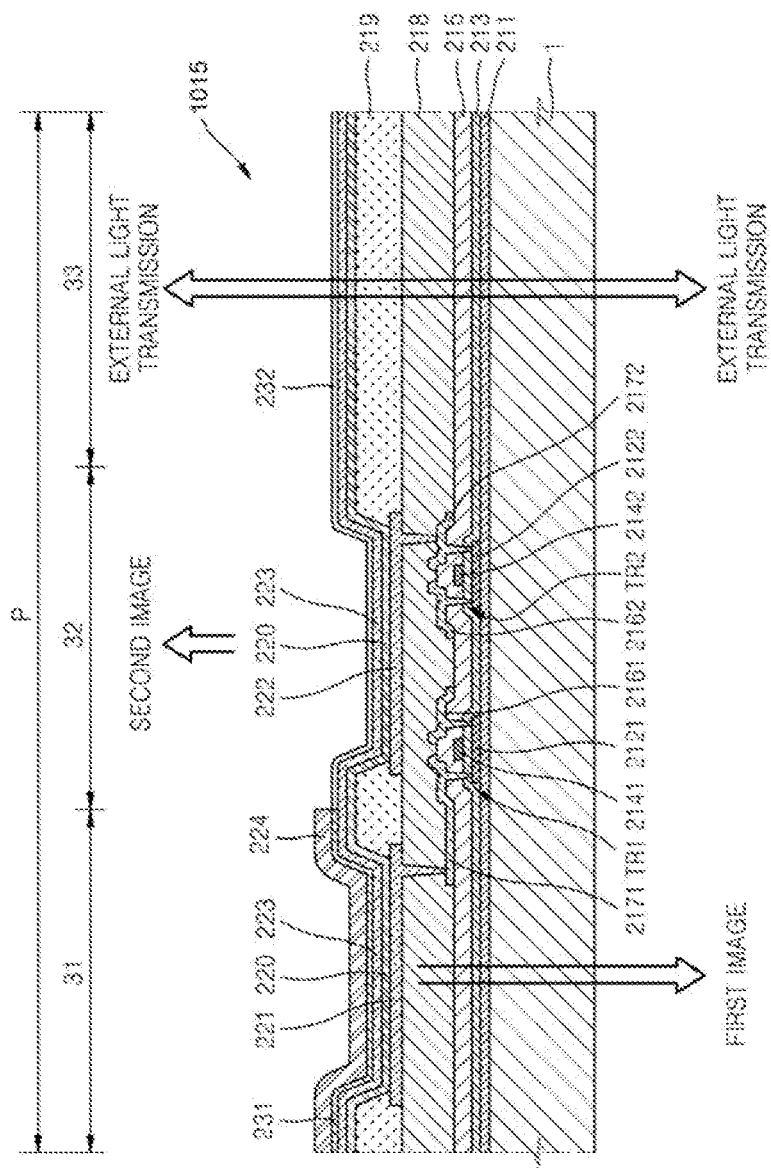
FIG. 15 is a cross-sectional view illustrating the pixel cut along line II-II of FIG. 14, according to an embodiment of the present invention.

FIG. 15 is a cross-sectional view illustrating a display unit 1015, which is a variation of a cross section of pixel P' of FIG. 14 cut along line II-II of FIG. 14, according to an embodiment of the present invention. In the embodiment of FIG. 15, the first auxiliary layer 231 is formed only in the first area 31, and the second auxiliary layer 232 is formed only in the second area 32 and the third area 33. Thus, the fourth electrode 224 may be selectively deposited only within the first area 31 but not within the second area 32 or the third area 33.

Accordingly, a decrease in transmissivity of external light in the third area 33, through which external light is transmitted, due to the fourth electrode 224, may be prevented, and a transparent dual emission display including an organic emitting unit having an increased external light transmissivity may be realized.

Figure 16:
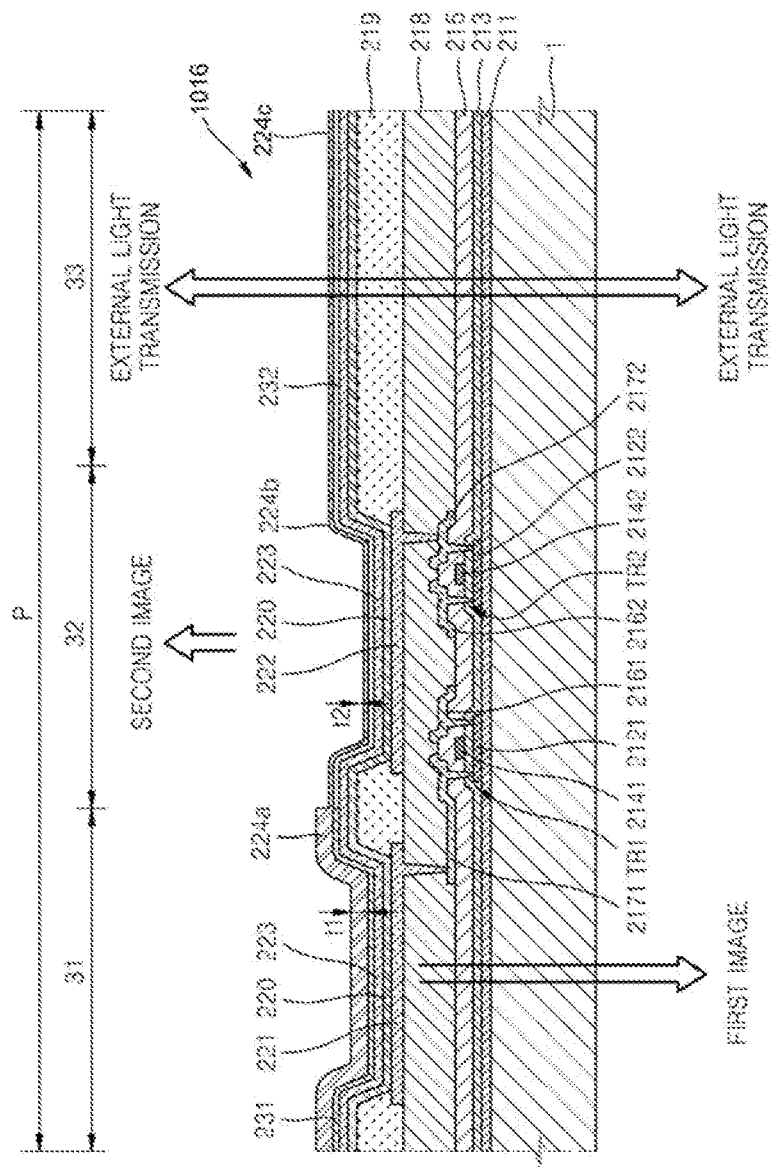
FIG. 16 is a cross-sectional view illustrating the pixel cut along line II-II of FIG. 14, according to another embodiment of the present invention.

FIG. 16 is a cross-sectional view illustrating the display unit 1016, which is a variation of a cross section of a variation of pixel P' of FIG. 14 cut along line II-II of FIG. 14, according to another embodiment of the present invention. Unlike the embodiment illustrated in FIG. 15, according to the embodiment of FIG. 16, the fourth electrode 224, which is a thin film, is also formed on the second auxiliary layer 232. Thus, the fourth electrode 224 is formed in the first area 31, the second area 32, and the third area 33.

Even if the metal for forming the fourth electrode is partially deposited on the second auxiliary layer 232, an amount of the metal is small, and thus, thicknesses t2 and t3 of portions 224b and 224c of the fourth electrode 224 that are located in the second area 32 and the third area 33 respectively are much less than a thickness t1 of a portion 224a of the fourth electrode 224 that is located in the first area 31. Thus, the transmissivity of the second image may not remarkably decrease due to the portion 224b of the fourth electrode 224 that is located within the second area 32, and also the transmissivity of external light may not remarkably decrease due to the portion 224c of the fourth electrode 224 that is located within the third area 33.

A structure of the third area 33 as described above may also be applied to the embodiment of FIG. 7, 8, 10, or 11. In these scenarios, a stack structure of the first auxiliary layer 231 and/or the second auxiliary layer 232 within the third area 33 may have the same stack structure as that of the first auxiliary layer 231 and/or the second auxiliary layer 232 within the first area 31.

Figure 17:
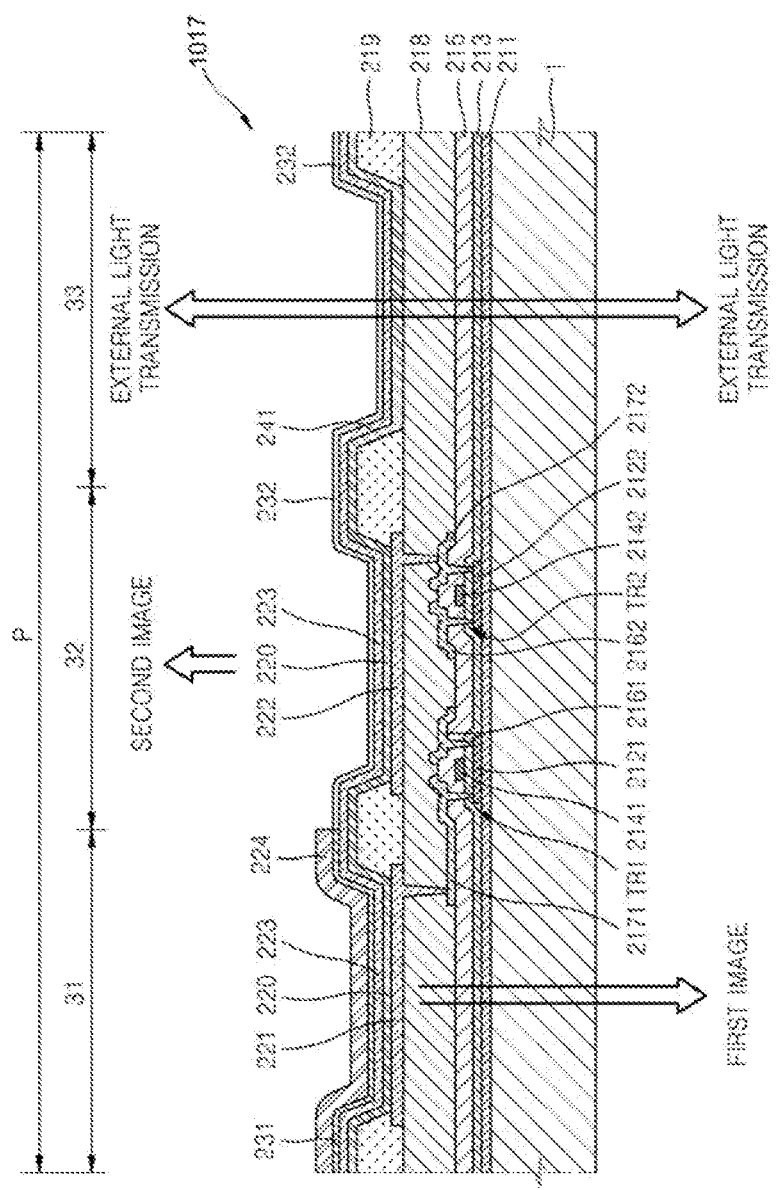
FIG. 17 is a cross-sectional view illustrating the pixel cut along line II-II of FIG. 14, according to another embodiment of the present invention.

FIG. 17 is a cross-sectional view illustrating a display unit 1017 which is a variation of a cross section of the pixel P' of FIG. 14 cut along line II-II of FIG. 14, according to another embodiment of the present invention. Unlike the display unit 25 of FIG. 15, in the display unit 27 of FIG. 17, the second insulating layer 219 further includes a transmission window 241 within the third area 33. The transmission window 241 is formed by removing a portion of the second insulating layer 219. As the transmission window 241 is formed within the third area 33, external light transmissivity within the third area 33 may be increased. While the transmission window 241 is illustrated as being formed only in the second insulating layer 219 of FIG. 17, the embodiments of the present invention are not limited thereto, as a transmission window connected to the transmission window 241 may also be further formed in at least one of the first insulating layer 218, the interlayer insulating layer 215, the gate insulating layer 213, and the buffer layer 211. Also, a transmission window that is connected to the transmission window 241 may be further formed in the third electrode 223.

It is also possible that the transmission window 241 having a structure as illustrated in the display unit 27 of FIG. 17 may also be applied to the display unit 26 of FIG. 16. Also, the transmission window 241 having the structure as illustrated in FIG. 17 may also be applied in the pixels as illustrated in FIG. 7, 8, 10, or 11 in which the third area 33 is formed.

As described above, according to the one or more of the above embodiments of the present invention, a fourth electrode made out of a metal may be formed by patterning the metal without using an additional patterning mask, thereby providing an advantage in the manufacturing process.

Also, a distance between an organic emitting layer and a fourth electrode in the bottom emission area may be increased to reduce exciton quenching, thereby increasing light-emitting efficiency.

The fourth electrode may not be formed in a third area through which external light is transmitted or the fourth electrode may be formed to have a thickness that is as small as possible, thereby increasing the total transmissivity of a the organic light-emitting display device.

Furthermore, wiring resistance of the third electrode may be reduced by the fourth electrode.

The organic light-emitting display device according to the embodiments of the present invention may be easily applied to a large display device.

According to the principles of the present invention, a dual emission display is realized by having each pixel comprised of a first sub-pixel that displays on the front side of the display only and a second sub-pixel that displays on a rear side of the display only. The pixel can further include a third sub-pixel which is transparent to allow external light to pass there through.

In the method of making the display device, the fourth or facing electrode is deposited selectively, by a vacuum deposition technique, on auxiliary layers on the display device. This is achieved by forming a first auxiliary layer in the first sub-pixel and a second auxiliary layer and a second sub-pixel, the first auxiliary layer having a greater bonding force or adhesive force to the material of the facing electrode than the second auxiliary layer. Consequently, on open mask can be used, and no patterning step is required.

Numerous embodiments have been disclosed, in which the first auxiliary layer is formed in both the first and second sub-pixels, in which the second auxiliary layer can be formed in the first and second sub-pixels, and in which the facing electrode can be formed in the second sub-pixel. When the facing electrode is formed in the second sub-pixel, as with the third electrode, it is formed to be very thin so that light may pass therethrough. When either of the first or second auxiliary layers are formed in both sub-pixels, the other of the auxiliary layer may be formed on or underneath the common auxiliary layer. By including the auxiliary layers along with intermediate layers in the diode display device, the organic emission layer can be spaced further apart from a reflecting electrode, thereby reducing the quenching of excitons. Consequently, the luminance can be improved while a dual display device can be realized, wherein an image displayed on the front side can be the same or different from the image on the backside. Furthermore, an easy method of manufacturing can be realized whereby a selective deposition of an electrode metal can be performed.

It should be understood that the exemplary embodiments described therein should be considered in a descriptive sense only and not for purposes of limitation. Descriptions of features or aspects within each embodiment should typically be considered as available for other similar features or aspects in other embodiments.

While one or more embodiments of the present invention have been described with reference to the figures, it will be understood by those of ordinary skill in the art that various changes in form and details may be made therein without departing from the spirit and scope of the present invention as defined by the following claims.

What is claimed is:

1. An organic light-emitting display (OLED) device, comprising:
    a plurality of pixels, each of the pixels including a first area in which light is emitted from the display device in a first direction and not in a second direction opposite to the first direction, a second area in which light is emitted from the display device in the second direction and not in the first direction and a third area that is transparent to external light;
    a plurality of first electrodes arranged within the first area of each of the plurality of pixels;
    a plurality of second electrodes arranged within the second area of each of the plurality of pixels;

an intermediate layer arranged on the plurality of first electrodes and the plurality of second electrodes, the intermediate layer including an organic emitting layer;
a third electrode arranged on the intermediate layer and within both the first area and the second area;
a first auxiliary layer arranged on the third electrode within the first area;
a second auxiliary layer arranged on the third electrode within the second area; and
at least one fourth electrode arranged on the first auxiliary layer within the first area, the first auxiliary layer being interposed between the fourth electrode and the third electrode.

2. The OLED device of claim 1, wherein the fourth electrode is absent from the second area and the third area.

3. The OLED device of claim 1, wherein a portion of the fourth electrode is arranged within the second area and the third area, and a thickness of the portion of the fourth electrode arranged within the second area and the third area is less than a thickness of a portion of the fourth electrode arranged within the first area.

4. The OLED device of claim 3, wherein the portion of the fourth electrode arranged within the second area is arranged on the second auxiliary layer.

5. An organic light-emitting display (OLED) device, comprising:
a plurality of pixels, each of the pixels including a first area in which light is emitted from the display device in a first direction and not in a second direction opposite to the first direction, a second area in which light is emitted from the display device in the second direction and not in the first direction and a third area that is transparent to external light;
a plurality of first electrodes arranged within the first area of each of the plurality of pixels;
a plurality of second electrodes arranged within the second area of each of the plurality of pixels;
an intermediate layer arranged on the plurality of first electrodes and the plurality of second electrodes, the intermediate layer including an organic emitting layer;
a third electrode arranged on the intermediate layer and within both the first area and the second area;
a first auxiliary layer arranged on the third electrode within the first area;
a second auxiliary layer arranged on the third electrode within the second area; and
a fourth electrode arranged on the first auxiliary layer within the first area, wherein the first auxiliary layer is absent from the second area and the third area.

6. The OLED device of claim 5, wherein the second auxiliary layer is absent from the first area.

7. The OLED device of claim 5, wherein a portion of the second auxiliary layer is arranged within the first area, and the first auxiliary layer is arranged on the portion of the second auxiliary layer arranged within the first area.

8. The OLED device of claim 1, wherein a portion of the first auxiliary layer is arranged within the second area, and the second auxiliary layer is arranged on the portion of the first auxiliary layer arranged within the second area.

9. The OLED device of claim 1, wherein a thickness of the fourth electrode is greater than a thickness of the third electrode.

10. The OLED device of claim 1, wherein an adhesive force of the fourth electrode with respect to the first auxiliary layer is greater than an adhesive force of the fourth electrode with respect to the second auxiliary layer.

11. The OLED device of claim 1, wherein the first auxiliary layer is comprised of a material selected from a group consisting of di-tungsten tetra(hexahydropyrimidopyrimidine)), fullerene, lithium fluoride (LiF), ADN [9,10-di(2-naphthyl)anthracene] and Liq: 8-hydroxyquinolinolato-lithium.

12. The OLED device of claim 1, wherein the second auxiliary layer is comprised of a material selected from a group consisting of N,N'-diphenyl-N,N'-bis(9-phenyl-9H-carbazol-3-yl)biphenyl-4,4'-diamine, N(diphenyl-4-yl)9,9-dimethyl-N-(4(9-phenyl-9H-carbazol-3-yl)phenyl)-9H-fluorene-2-amine, 2-(4-(9,10-di(naphthalene-2-yl)anthracene-2-yl)phenyl)-1-phenyl-1H-benzo-[D]imidazole, α-NPD (N,N'-bis(1-naphthyl)-N,N-diphenyl[1,1'-biphenyl]-4,4'-diamine) and TPD [4,4'-Bis[N-(3-methylphenyl)-N-phenylamino]biphenyl].

13. The OLED device of claim 1, wherein the intermediate layer is further comprised of:
a first intermediate layer interposed between the organic emitting layer and the first and the second electrodes and including at least one of a hole injection layer and a hole transport layer; and
a second intermediate layer interposed between the organic light emitting layer and the third electrode, the second intermediate layer including at least one of an electron injection layer and an electron transport layer, wherein the first intermediate layer is thicker than the second intermediate layer.

14. The OLED device of claim 1, wherein the OLED device is produced by a process comprising:
defining the plurality of pixels;
forming the plurality of first electrodes within the first area of each of the plurality of pixels;
forming the plurality of second electrodes within the second area of each of the plurality of pixels;
forming the intermediate layer on the plurality of first electrodes and on the plurality of second electrodes;
forming the third electrode on the intermediate layer within both the first area and the second area of each of the pixels by depositing a metal for forming the third electrode;
forming the first auxiliary layer on the third electrode within the first area;
forming the second auxiliary layer on the third electrode within the second area; and
forming the fourth electrode within the first area via a vacuum deposition technique by applying a vapor that includes a metal for forming the fourth electrode to a top surface of the first auxiliary layer within the first area and a top surface of the second auxiliary layer within the second area of each pixel.

15. The OLED device of claim 1, wherein the second auxiliary layer is absent from the first area.

16. The OLED device of claim 1, wherein a portion of the second auxiliary layer is arranged within the first area of each of the pixels, and the first auxiliary layer is arranged on the portion of the second auxiliary layer arranged within the first area of each of the pixels.

17. The OLED device of claim 1, the fourth electrode is spaced-apart from the third electrode by at least the first auxiliary layer, the fourth electrode is electrically connected to the third electrode at a location external to the first and the second areas.

18. The OLED device of claim 1, the first and the second auxiliary layers being distinguished from the intermediate layer and being spaced-apart from the intermediate layer by at least the third electrode.

19. The OLED device of claim 1, the intermediate layer within the first area is spaced apart from the fourth electrode by at least the third electrode and the first auxiliary layer.

20. The OLED device of claim 1, the organic emitting layer of the intermediate layer within the first area is spaced apart from the fourth electrode by at least the third electrode, the first auxiliary layer and at least one of an electron transport layer and an electron injection layer of the intermediate layer.

21. The OLED device of claim 1, wherein each of the second electrodes and the fourth electrode are reflecting electrodes that reflect all visible light, while each of the first electrodes and the third electrode transmit visible light.

22. The OLED device of claim 13, the second electrodes being reflecting electrodes for the second area of each of the pixels, the organic emitting layer in the second area of each of the pixels being spaced apart from the second electrodes by the first intermediate layer.

23. The OLED device of claim 22, the fourth electrode being a reflecting electrode for the first area, the organic emitting layer within the first area being spaced apart from the fourth electrode by at least the third electrode, the first auxiliary layer and the second intermediate layer.

24. The OLED device of claim 1, the organic emitting layer of the intermediate layer within the first area is spaced apart from the fourth electrode by at least the third electrode, the first auxiliary layer, a portion of the second auxiliary layer and at least one of an electron transport layer and an electron injection layer of the intermediate layer.

25. The OLED device of claim 1, wherein the first electrodes, the intermediate layer, the third electrode, the first auxiliary layer and the fourth electrode are sequentially stacked on a substrate in the first area, and the second electrodes, the intermediate layer, the third electrode and the second auxiliary layer are sequentially stacked on the substrate in the second area.

* * * * *